United States Patent
Peter et al.

(10) Patent No.: US 12,550,646 B2
(45) Date of Patent: Feb. 10, 2026

(54) SELECTIVELY ETCHING FOR NANOWIRES

(71) Applicant: Lam Research Corporation, Fremont, CA (US)

(72) Inventors: Daniel Peter, Campbell, CA (US); Jun Xue, San Jose, CA (US); Samantha SiamHwa Tan, Fremont, CA (US); Yang Pan, Los Altos, CA (US); Younghee Lee, Pleasanton, CA (US); Alexander Kabansky, Santa Clara, CA (US)

(73) Assignee: Lam Research Corporation, Fremont, CA (US)

( * ) Notice: Subject to any disclaimer, the term of this patent is extended or adjusted under 35 U.S.C. 154(b) by 756 days.

(21) Appl. No.: 17/257,241

(22) PCT Filed: Jul. 12, 2019

(86) PCT No.: PCT/US2019/041573
§ 371 (c)(1),
(2) Date: Dec. 30, 2020

(87) PCT Pub. No.: WO2020/018366
PCT Pub. Date: Jan. 23, 2020

(65) Prior Publication Data
US 2021/0272814 A1    Sep. 2, 2021

Related U.S. Application Data

(60) Provisional application No. 62/701,314, filed on Jul. 20, 2018.

(51) Int. Cl.
*H01L 21/3065* (2006.01)
*H01L 21/02* (2006.01)

(52) U.S. Cl.
CPC .... *H01L 21/3065* (2013.01); *H01L 21/02164* (2013.01); *H01L 21/02167* (2013.01); *H01L 21/0217* (2013.01); *H01L 21/0228* (2013.01)

(58) Field of Classification Search
CPC .................. H01L 21/02019; H01L 21/3065
See application file for complete search history.

(56) References Cited

U.S. PATENT DOCUMENTS

| | | |
|---|---|---|
| 7,682,985 B2 | 3/2010 | Koemtzopoulos et al. |
| 9,236,265 B2 | 1/2016 | Korolik et al. |

(Continued)

FOREIGN PATENT DOCUMENTS

| | | |
|---|---|---|
| CN | 1954416 | 4/2007 |
| JP | 2013-225604 | 10/2013 |

(Continued)

OTHER PUBLICATIONS

International Search Report for International Application No. PCT/US2019/041573 dated Nov. 5, 2019.

(Continued)

*Primary Examiner* — Thomas T Pham
(74) *Attorney, Agent, or Firm* — Beyer Law Group LLP

(57) ABSTRACT

A method for selectively etching silicon germanium with respect to silicon in a stack on a chuck in an etch chamber is provided. The chuck is maintained at a temperature below 15° C. The stack is exposed to an etch gas comprising a fluorine containing gas to selectively etch silicon germanium with respect to silicon.

14 Claims, 8 Drawing Sheets

(56) References Cited

U.S. PATENT DOCUMENTS

| | | | |
|---|---|---|---|
| 9,966,253 B2* | 5/2018 | Cheng | H01J 9/025 |
| 10,096,688 B2 | 10/2018 | Tak et al. | |
| 10,312,079 B2 | 6/2019 | Takeya et al. | |
| 10,418,487 B2 | 9/2019 | Rachmady et al. | |
| 10,446,606 B2* | 10/2019 | Kumar | H10B 61/22 |
| 2004/0157396 A1* | 8/2004 | Lee | H01L 29/78645 |
| | | | 257/E21.654 |
| 2011/0003451 A1* | 1/2011 | Orlowski | H01L 29/78696 |
| | | | 257/E21.409 |
| 2012/0129354 A1 | 5/2012 | Luong | |
| 2012/0225557 A1 | 9/2012 | Serry et al. | |
| 2015/0126040 A1* | 5/2015 | Korolik | H01J 37/32724 |
| | | | 438/718 |
| 2015/0372118 A1 | 12/2015 | Zhang et al. | |
| 2015/0372119 A1 | 12/2015 | Zhang et al. | |
| 2016/0133745 A1* | 5/2016 | Kittl | H01L 21/28568 |
| | | | 438/197 |
| 2017/0005176 A1 | 1/2017 | Sung et al. | |
| 2018/0090315 A1 | 3/2018 | Bi et al. | |
| 2019/0198637 A1* | 6/2019 | Li | H01L 29/66477 |
| 2019/0214473 A1* | 7/2019 | Xie | H01L 29/0649 |
| 2019/0378906 A1* | 12/2019 | Loubet | H01L 21/823807 |
| 2019/0393304 A1* | 12/2019 | Guillorn | H01L 21/308 |
| 2020/0066894 A1* | 2/2020 | Frougier | H10D 30/014 |

FOREIGN PATENT DOCUMENTS

| | | |
|---|---|---|
| KR | 10-2016-0101213 | 8/2016 |
| KR | 10-2017-0044525 | 4/2017 |
| TW | 201631653 | 9/2016 |
| WO | 2020/018366 | 1/2020 |

OTHER PUBLICATIONS

Written Opinion for International Application No. PCT/US2019/041573 dated Nov. 5, 2019.

Ahles, Christopher F et al., "Selective Etching of Silicon in Preference to Germanium and Si0.5Ge0.5", Applied Materials & Interfaces, Materials Science and Engineering Program and ‡Department of Chemistry and Biochemistry, pp. 20947-20954, American Chemical Society, Copyright 2017.

Taiwanese Office Action from Taiwanese Application No. 108125771 dated Apr. 18, 2023.

Korean Office Action from Korean Application No. 10-2021-7005097 dated Apr. 11, 2024 with machine translation.

Chinese First Office Action from Chinese Application No. 201980048517.9 dated May 31, 2024 with machine translation.

Taiwanese Office Action from Taiwanese Application No. 113128311 dated Apr. 28, 2025 with Machine Translation.

Chinese Second Office Action from Chinese Application No. 201980048517.9 dated Jan. 24, 2025 with Machine Translation.

Korean Office Action from Korean Application No. 10-2021-7005097 dated Jan. 14, 2025 with Machine Translation.

Korean Office Action from Korean Publication No. 9-5-2025-087645665 dated Sep. 10, 2025 with Machine Translation.

Taiwanese Office Action from Taiwanese Application No. 113128311 dated Oct. 22, 2025 with Machine Translation.

* cited by examiner

US 12,550,646 B2

SELECTIVELY ETCHING FOR NANOWIRES

CROSS REFERENCE TO RELATED APPLICATION

This application claims the benefit of priority of U.S. Application No. 62/701,314, filed Jul. 20, 2018, which is incorporated herein by reference for all purposes.

BACKGROUND

The disclosure generally relates to methods of forming semiconductor devices on a semiconductor wafer. More specifically, the disclosure relates to the selective etching of nanowires.

In forming semiconductor devices, nanowires may be formed by selectively etching silicon germanium (SiGe) with respect to silicon (Si). Nanowires may also be formed by selectively etching Si with respect to SiGe.

SUMMARY

To achieve the foregoing and in accordance with the purpose of the present disclosure, a method for selectively etching silicon germanium with respect to silicon in a stack on a chuck in an etch chamber is provided. The chuck is maintained at a temperature below 15° C. The stack is exposed to an etch gas comprising a fluorine containing gas to selectively etch silicon germanium with respect to silicon.

In another manifestation, a method for selectively etching silicon with respect to silicon germanium in a stack on a chuck in an etch chamber is provided. The chuck is maintained at a temperature below 15° C. The stack is exposed to an etch gas comprising hydrogen ($H_2$), and a fluorine containing gas to selectively etch silicon with respect to silicon germanium.

These and other features of the present disclosure will be described in more details below in the detailed description and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF THE EXEMPLARY EMBODIMENTS

The present disclosure will now be described in detail with reference to a few exemplary embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well-known process steps and/or structures have not been described in detail in order to not unnecessarily obscure the present disclosure.

In an embodiment, to form nanowires a stack of alternating Si layers and SiGe layers is provided. The Si layer and SiGe layers may extend between and be connected to electrical contacts or other structures. If the SiGe layers are selectively etched away then the Si layers remain extending between the electrical contacts. The Si layers may be used as nanowires. Similarly, if the Si layers are selectively etched away then the SiGe layers remain extending between the electrical contacts. The SiGe layers may be used as nanowires. The dimensions of the Si layers and SiGe layers are so small that the etch should be highly selective. Other processes should be provided to minimize the removal of the layers that are not etched.

Figure 2:
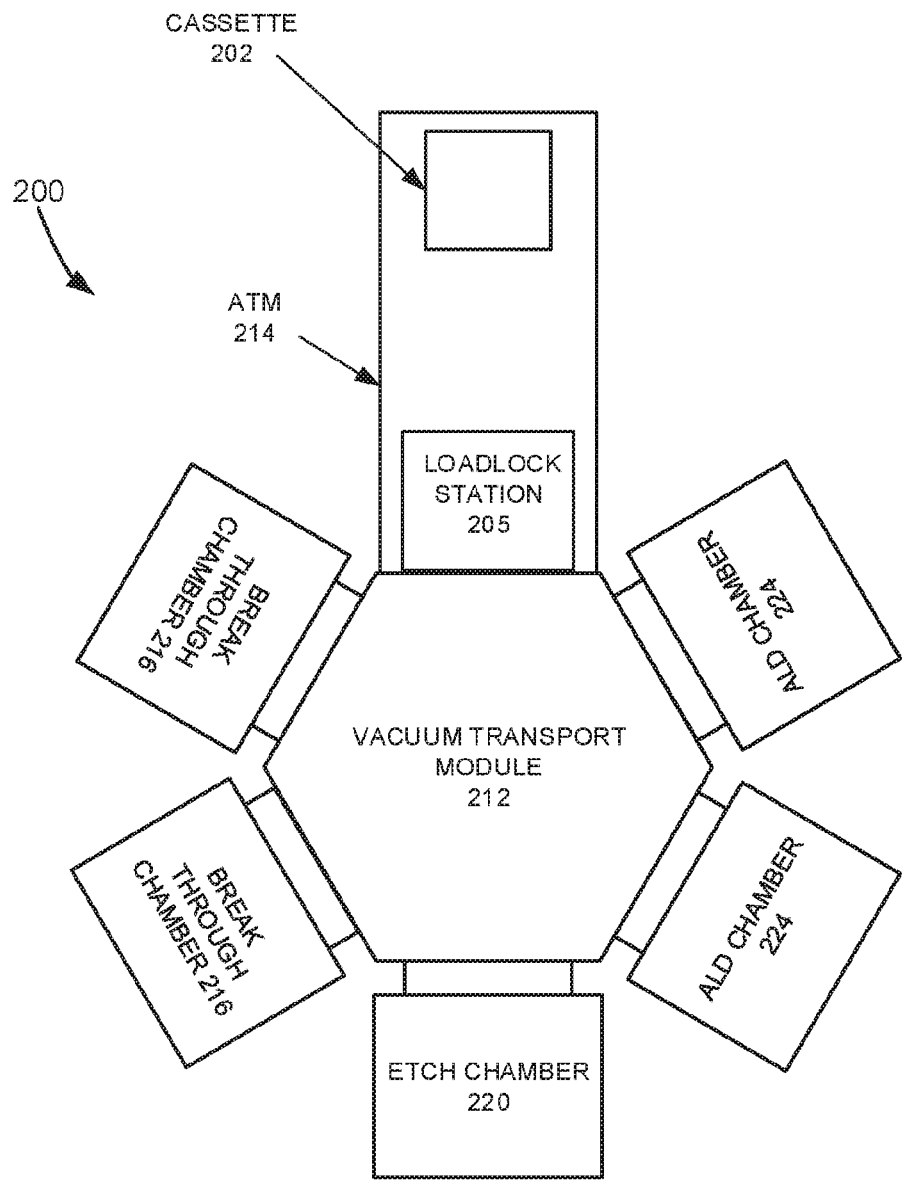
FIG. 2 is a top schematic view of a processing tool that may be used in an embodiment.

FIG. 2 is a top schematic view of a processing tool 200 used in an embodiment. A cassette 202 houses unprocessed wafers before they are processed and then holds the treated wafers once all processing is complete in the processing tool 200. The cassette 202 can hold many wafers, often as many as 25. An atmosphere transport module (ATM) 214 is used to transport wafers to and from the cassette 202. A load lock station 205 represents at least one device that operates to transfer the wafer back and forth between the atmosphere of the ATM 214 and the vacuum of a vacuum transport module (VTM) 212. The VTM 212 is part of the processing tool and connects to a plurality of chambers. There may be different types of chambers. In this embodiment, there are two break through chambers 216, an etch chamber 220, and two atomic layer deposition (ALD) chambers 224. A robotic system within the vacuum transport module 212 uses a robotic arm to move a wafer with a stack between the load lock station 205 and the different chambers 216, 220, 224. The ATM 214 uses a robotic system to transfer wafers between the cassette 202 and the load lock station 205 in a vacuum environment.

Figure 3:
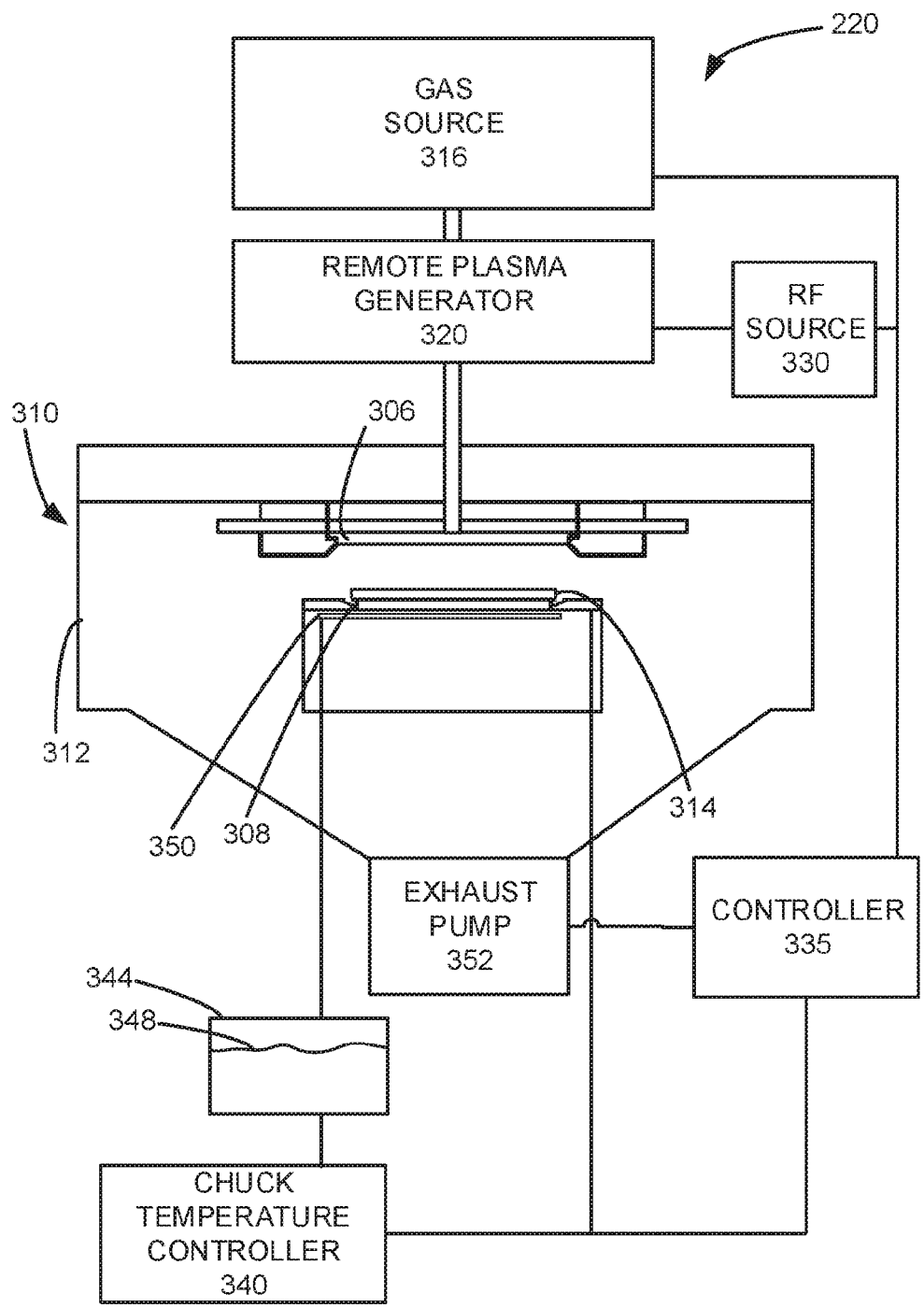
FIG. 3 is a schematic view of an etch chamber that may be used in an embodiment.

FIG. 3 is a more detailed schematic view of the etch chamber 220 which may be used in an embodiment. In one or more embodiments, the etch chamber 220 comprises a shower head 306 providing a gas inlet and a chuck 308, within a reactor chamber 310, enclosed by a chamber wall 312. Within the reactor chamber 310, a stack 314 is positioned over the chuck 308. A gas source 316 is connected to a remote plasma generator 320. The remote plasma generator 320 is connected to the reactor chamber 310 through the shower head 306. A radio frequency (RF) source 330 provides RF power at 13.56 megahertz (MHz) to the remote plasma generator 320. In this embodiment, the RF source 330 provides power to coils. The power creates an inductively coupled plasma in the remote plasma generator 320. A chuck temperature controller 340 controls a chiller 344. The chiller 344 cools a coolant 348. The coolant is provided to a chuck cooling system 350. A controller 335 is controllably connected to the RF source 330, an exhaust pump 352, the chuck temperature controller 340, and the gas source 316.

Figure 4:
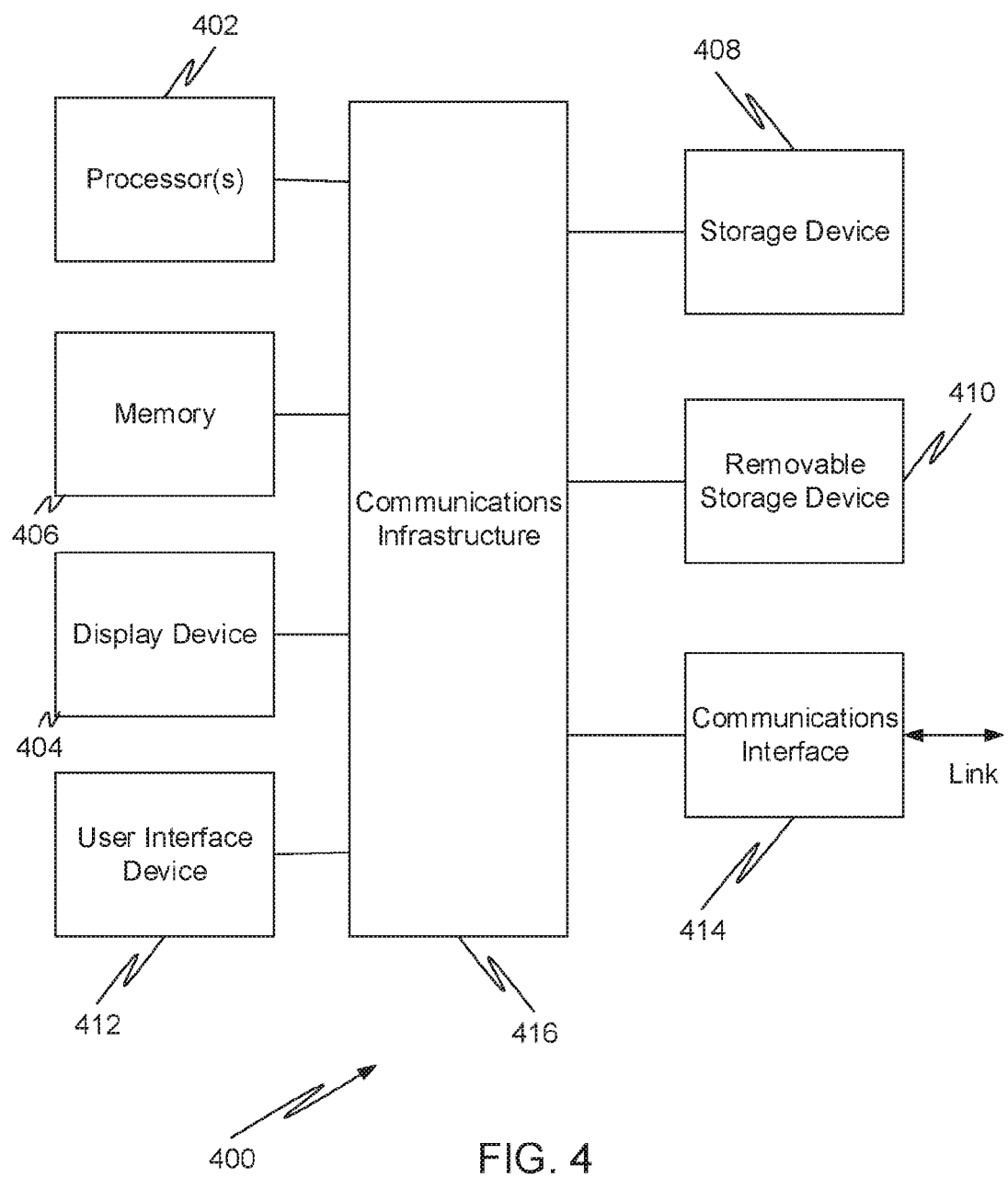
FIG. 4 is a schematic view of a computer system that may be used in practicing an embodiment.

FIG. 4 is a high level block diagram showing a computer system 400, which is suitable for implementing a controller 335 used in embodiments. The computer system 400 may have many physical forms ranging from an integrated circuit, a printed circuit board, and a small handheld device up to a huge supercomputer. The computer system 400 includes one or more processors 402, and further can include an electronic display device 404 (for displaying graphics, text, and other data), a main memory 406 (e.g., random access memory (RAM)), storage device 408 (e.g., hard disk drive), removable storage device 410 (e.g., optical disk drive), user interface devices 412 (e.g., keyboards, touch screens, keypads, mice or other pointing devices, etc.), and a communications interface 414 (e.g., wireless network interface). The communications interface 414 allows software and data to be transferred between the computer system 400 and external devices via a link. The system may also include a communications infrastructure 416 (e.g., a communications bus, cross-over bar, or network) to which the aforementioned devices/modules are connected.

Information transferred via communications interface 414 may be in the form of signals such as electronic, electromagnetic, optical, or other signals capable of being received by communications interface 414, via a communications link that carries signals and may be implemented using wire or cable, fiber optics, a phone line, a cellular phone link, a radio frequency link, and/or other communications channels. With such a communications interface 414, it is contemplated that the one or more processors 402 might receive information from a network, or might output information to the network in the course of performing the above-described method steps. Furthermore, method embodiments may execute solely upon the processors or may execute over a network such as the Internet, in conjunction with remote processors that share a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal a processor.

Figure 1:
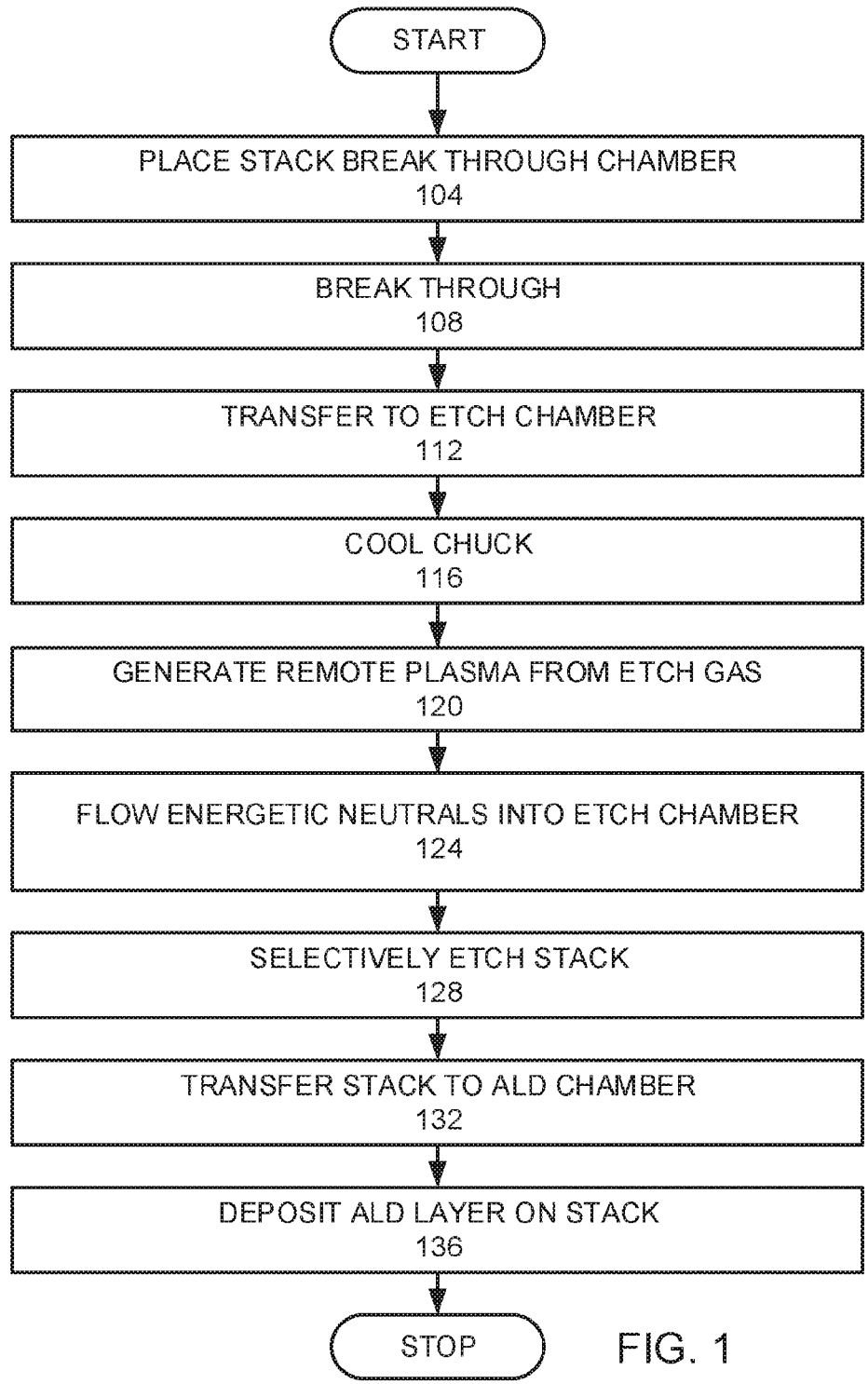
FIG. 1 is a high level flow chart of an embodiment.
Figure 5A:
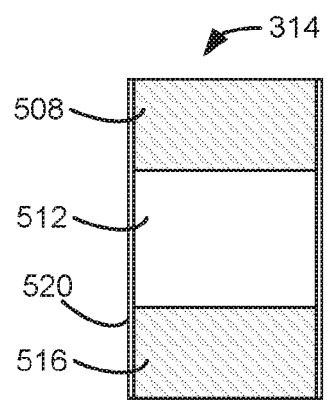
FIGS. 5A-D are schematic cross-sectional views of a stack processed according to an embodiment.

FIG. 1 is a high level flow chart of an embodiment. In an exemplary embodiment, a stack is placed in a break through chamber 216 (step 104). The break through chamber 216 is a chamber used to break through or remove a layer to provide access to the material to be etched. FIG. 5A is a schematic cross-sectional view of part of a stack 314 on a wafer. In this embodiment, the stack 314 comprises a first Si layer 508 adjacent to a SiGe layer 512. The SiGe layer 512 is adjacent to a second Si layer 516. The first Si layer 508 and the second Si layer 516 are on opposite sides of the SiGe layer 512. The first Si layer 508, the SiGe layer 512, and the second Si layer 516 extend between and are connected to two structures, which are not shown. An encapsulating layer in the form of a native oxide layer 520 forms on the sides of the first Si layer 508, SiGe layer 512, and second Si layer 516, due to the exposure of the stack 314 to air. Alternatively, the stack 314 may be encapsulated by another type of encapsulating layer, such as an ALD silicon oxide ($SiO_2$), silicon carbide (SiC), or silicon nitride (SiN). The encapsulating layer may be deposited to prevent the formation of the encapsulation layer formed by a native oxidation.

Figure 5B:
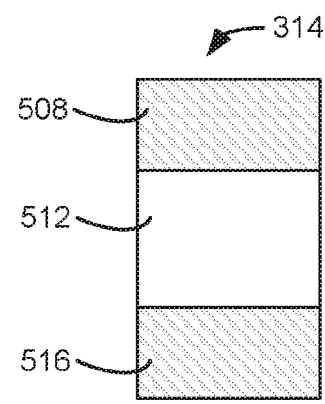

After the stack 314 has been placed into the break through chamber 216, a break through process is provided to remove the encapsulating layer, i.e., the native oxide layer 520 (step 108). In this example, the break through process is a wet etch process. The break through is provided by exposing the stack 314 to a solution of diluted hydrofluoric acid (49%) in water with a volume dilution of 300:1-10:1 at room temperature (RT) for 10-300 seconds. FIG. 5B is a cross-sectional view of the stack 314 after the native oxide layer 520 has been removed.

The VTM 212 transports the stack 314 from the break through chamber 216 to the etch chamber 220 in a vacuum environment (step 112). If the stack 314 is not maintained in a vacuum environment, a new native oxide layer would grow on the stack 314. The stack 314 is mounted on the chuck 308 in the etch chamber 220.

The chuck is cooled (step 116). In this example, the chuck is cooled to a temperature of −15° C. or less. In this example, the chiller 344 cools the coolant 348 to a temperature of about −60° C. A remote plasma is generated from an etch gas (step 120). In this example, the etch gas is 45 sccm carbon tetra fluoride ($CF_4$), 1000 sccm argon (Ar), and 1000 sccm helium (He). In this example, the etch gas is hydrogen free or essentially hydrogen free. The etch gas flows from the gas source 316 to the remote plasma generator 320. The RF source 330 provides 200 watts of RF power at 13.56 megahertz (MHz) to the remote plasma generator 320. The etch gas is transformed into plasma ions and energetic neutrals of the etch gas in the remote plasma generator 320.

Figure 5C:
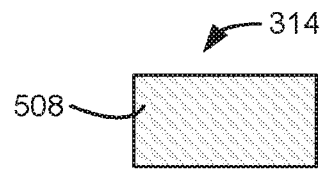
Figure 5C:
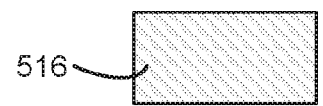

Energetic neutrals flow from the remote plasma generator 320 through the shower head 306 into the reactor chamber 310. Energetic neutrals may be energetic neutral atoms or energetic neutral molecules of the etch gas. Energetic neutrals may include energetic radical molecules or atoms. In this example, plasma ions do not flow into the reactor chamber 310. The reactor chamber pressure is maintained at no less than 300 mTorr. The energetic neutrals selectively etch the stack 314 (step 128) by selectively etching SiGe with respect to Si. In this example, the selectively etching SiGe with respect to Si has a SiGe to Si etch ratio of greater than 20:1. FIG. 5C is a cross-sectional view of the stack 314 after the SiGe layer 512 has been selectively etched (step 128). In this example, the SiGe layer 512 has been completely etched away leaving the first and second Si layers 508, 516. The first and second Si layers 508, 516 may extend between the two structures.

The VTM 212 transports the stack 314 from the etch chamber 220 to an ALD chamber 224 in a vacuum environment (step 132). If the stack 314 is not maintained in a vacuum environment, a new native oxide layer would grow on the stack 314. Such a new native oxide layer would consume some of the first and second Si layers 508, 516.

Figure 6:
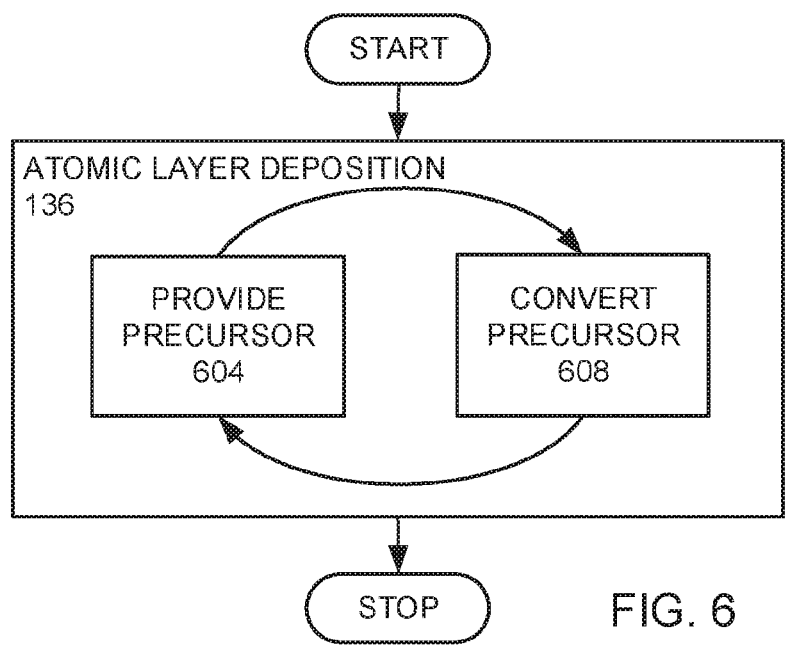
FIG. 6 is a more detailed flow chart of an atomic layer deposition process.

An ALD layer is deposited on the stack 314 (step 136). FIG. 6 is a more detailed flow chart of the atomic layer deposition process (step 136). The atomic layer deposition process (step 136) comprises at least one cycle of providing a precursor (step 604) and converting the precursor (step 608). The precursor is provided to the stack 314 (step 604). In this embodiment, a liquid silicon containing precursor is vaporized and delivered in vapor form into the ALD chamber 224 to dose the stack 314 to saturation. As a result, a layer of precursor is formed over the stack 314. In this example, the precursor has a composition of the general type $C(x)H(y)N(z)O(a)Si(b)$. In some embodiments, the precursor has one of the following compositions: N,N,N',N',N'',N''-Hexamethylsilanetriamine ($C_6H_{19}N_3Si$, $C_8H_{22}N_2Si$), (3-Aminopropyl)triethoxysilane ($C_9H_{23}NO_3Si$), and Tetra(isopropoxy)silane ($C_{12}H_{28}O_4Si$). In this example, the providing of the precursor is plasmaless. The precursor has a silicon function group. The precursor forms a monolayer on the stack 314 since the precursor does not attach to another precursor.

Figure 5D:
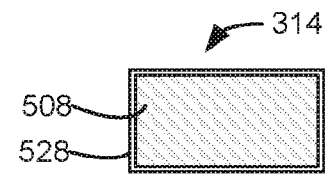
Figure 5D:
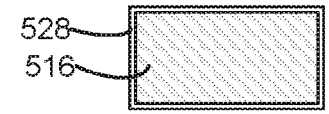

Once the stack 314 is dosed with the precursor, the delivery of the precursor vapor is stopped. Then a purge step is provided to purge out excessive precursor that lingers in the ALD chamber 224. The precursor is then converted (step 608). In one embodiment, this is accomplished by subjecting the stack 314 to a flash process. The flash process includes delivering a flash gas of 1000 sccm to 2000 sccm oxygen ($O_2$) to the ALD chamber 224. In this example, a power of 100 to 3000 watts is delivered at 13.56 MHz to transform the flash gas into a plasma. A pressure of 20 mTorr to 100 mTorr is provided. This flash process is referred to as an "$O_2$ flash" operation, since the time during which the power is delivered is relatively fast, e.g., between about 0.5 second and about 4 seconds. The $O_2$ flash operation forms a silicon oxide monolayer on the stack 314 using the monolayer of the silicon containing precursor. Once the $O_2$ flash operation is completed, the ALD chamber 224 is purged. The cycle may then be repeated. FIG. 5D is a cross-sectional view of the stack 314 after an ALD layer 528 has been deposited to encircle or encapsulate the entire periphery of the Si layers 508, 516. The ALD layer 528 prevents the Si layers 508, 516 from being consumed by native oxide formation. Native oxides would consume about 7 Å to about 8 Å of the Si layers 508, 516 without the ALD layer 528.

The resulting encapsulated Si layers 508, 516 may extend between the two structures. As a result, the first and second Si layers 508, 516 are used as horizontal nanowires for n-type metal-oxide-semiconductor (NMOS) devices. This embodiment provides an etch selectivity greater than 20:1 for etching SiGe with respect to Si. In addition, less than 5 Å of Si is lost due to oxidation or etching during the process. This embodiment selectively etches SiGe with respect to silicon oxide ($SiO_2$) and silicon nitride (SiN) with a selectivity of greater than 100:1. Since the embodiment selectively etches SiGe with respect to $SiO_2$ and SiN with a selectivity greater than 100:1, this embodiment has a separate break through step to etch $SiO_2$ or SiN. In one embodiment, the selective etch of SiGe can be performed in less than 60 seconds.

It has been unexpectedly found that maintaining a low temperature while selectively etching the SiGe layer 512 with respect to the Si layers 508, 516 increases selectivity. In an exemplary embodiment, the chuck 308 is cooled to a temperature of less than 15° C. In another exemplary embodiment, the chuck 308 is cooled to a temperature of less than 0° C. In another exemplary embodiment, the chuck 308 is cooled to a temperature of less than or equal to −15° C. In another exemplary embodiment, the chuck 308 is cooled to a temperature of less than or equal to −40° C. In some embodiments, liquid nitrogen is used as a coolant that is flowed through the chuck 308 to provide cooling. In other embodiments, liquid Vertel Sinera™ manufactured by DuPont Corporation of Wilmington, DE may be used as the coolant. Such coolants may be cooled to −60° C.

In various embodiments, the etch gas comprises a fluorine containing component. In various embodiments, the fluorine containing component is a fluorocarbon, such as $CF_4$, hexafluoro-2-butyne ($C_4F_6$), or octafluorocyclobutane ($C_4F_8$) or a hydrofluorocarbon, such as fluoroform ($CHF_3$) or difluoromethane ($CH_2F_2$). In various embodiments, the etch gas has a total flow per etch gas molecule. The fluorine containing component comprises fluorine. The fluorine containing component has a fluorine flow per fluorine atom. A ratio of the total flow of the etch gas per etch gas molecule to the fluorine flow per fluorine atom is from 1000:1 to 3:1. For example, in the above embodiment, the etch gas was 45 sccm $CF_4$, 1000 sccm Ar, and 1000 sccm He. In this example, since there are 4 fluorine atoms in $CF_4$, the flow rate of fluorine atoms is 180 sccm. The total flow rate of all molecules of the etch gas is 2045 sccm. Therefore, the ratio of the total flow rate of the etch gas to the flow rate of fluorine atoms is 2045:180. 2045:180 is about 11:1. In order to lower the percentage of fluorine atoms compared to the total etch gas flow, one or more inert gases such as noble gases are added to the etch gas. The noble gases may be used as a diluent in order to provide a more controllable process.

During etching, energetic neutral molecules of the etch gas are used to selectively etch the SiGe layer 512 with respect to the Si layers 508, 516. To provide such an etch, the energetic neutral molecules are generated by a remote plasma instead of exposing the stack 314 to a plasma. In a plasma, the stack 314 would be bombarded by more ions than energetic neutral molecules. Reducing the ions that bombard the stack 314 helps to reduce the etching of the Si layers 508, 516. To further reduce etching of the Si layers 508, 516, the remote plasma is generated using a low RF power. In various embodiments, the RF power provided to generate the remote plasma is less than 300 watts. In addition, a bias of less than 50 volts is provided in various embodiments. In an exemplary embodiment, a bias is not provided. Without the bias, ions are not accelerated to the stack 314. An exemplary embodiment does not provide any RF power to the reactor chamber 310, where the stack 314 is located, but only to the remote plasma generator 320. The remote plasma generator 320 is located outside of the reactor chamber 310. The remote plasma generator 320 is separated from the reactor chamber 310 by the shower head 306. A large gap of at least 50 mm is between the shower head 306 and the top of the stack 314, to further reduce the number of ions that reach the stack 314. In some embodiments, since the plasma is formed outside of the reactor chamber 310, the process in the reactor chamber 310 is plasmaless.

The pressure in the reactor chamber 310 maintained at no less than 300 mTorr. In an exemplary embodiment, the pressure is at least 500 mTorr. The higher pressure facilitates the selective etching of the SiGe layer 512 with respect to the Si layers 508, 516. Pressures of less than 100 mTorr would be used for etch processes that are dependent on ion etching. Instead, since various embodiments use energetic neutrals to etch, the pressure is maintained at no less than 300 mTorr. The higher pressure facilitates etching using energetic neutrals instead of ions. In addition, the higher pressure helps reduce the presence of ions and reduces undesirable species. It is believed that various embodiments may provide an etch selectivity of SiGe to Si of at least 50:1.

The break through step of the native oxide (step 108) removes the native oxide layer to allow the subsequent etching of the SiGe layer 512. The transfer of the stack 314 from a break through chamber 216 to the etch chamber 220 (step 112) under vacuum prevents a native oxide layer from regrowing during the transfer. The transfer of the stack 314 from the etch chamber 220 to the ALD chamber 224 (step 132) is performed under vacuum to prevent a native oxide from forming on the Si layers 508, 516. The formation of such a native oxide layer would consume some of the Si layers 508, 516. The consumption of some of the Si layers 508, 516 by the formation of the native oxide causes some of the Si layers 508, 516 to be removed. The deposition of the ALD layer 528 (step 136), forms a layer over the Si layers 508, 516 without consuming the silicon of the Si layers 508, 516.

Figure 7A:
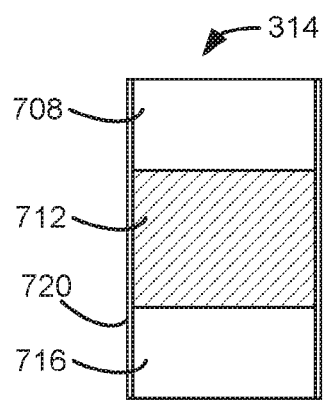
FIGS. 7A-D are schematic cross-sectional views of a stack processed according to another embodiment.

In another embodiment, a Si layer is selectively etched with respect to SiGe layers. FIG. 7A is a schematic cross-sectional view of a stack 314. In this embodiment, the stack 314 comprises a first SiGe layer 708 adjacent to a Si layer 712. The Si layer 712 is adjacent to a second SiGe layer 716. The first SiGe layer 708 and the second SiGe layer 716 are on opposite sides of the Si layer 712. A native oxide layer 720 forms on the sides of the first SiGe layer 708, Si layer 712, and second SiGe layer 716, due to the exposure of the stack 314 to air.

Figure 7B:
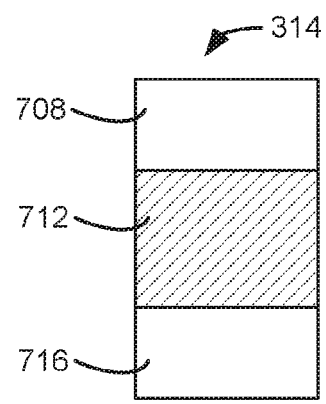

The stack 314 is placed into the break through chamber 216. A break through is provided to remove the native oxide layer 520 (step 108). In this example, the break through is provided by exposing the stack 314 to a solution of diluted hydrofluoric acid (49%) in water with a volume dilution of 300:1-10:1 at RT for 10-300 seconds. FIG. 7B is a cross-sectional view of the stack 314 after the native oxide layer 720 has been removed.

The VTM 212 transports the stack 314 from the break through chamber 216 to the etch chamber 220 in a vacuum environment (step 112). The stack 314 is mounted on the chuck 308 in the etch chamber 220.

The chuck 308 is cooled (step 116). In this example, the chuck 308 is cooled to a temperature of no more than −15° C. In this example, the chiller 344 cools the coolant 348 to a temperature of about −60° C. A remote plasma is generated from an etch gas (step 120). In this example, the etch gas is 10 sccm $CF_4$, 100 sccm $H_2$, 1000 sccm Ar, and 1000 sccm He. A small flow of sulfur hexafluoride ($SF_6$) or hydrogen sulfide ($H_2S$) (0-100 sccm) may be added to improve selectivity. The etch gas flows from the gas source 316 to the remote plasma generator 320. The RF source 330 provides 200 watts of RF power at 13.56 MHz to the remote plasma generator 320. The etch gas is transformed into a plasma in the remote plasma generator 320.

Figure 7C:
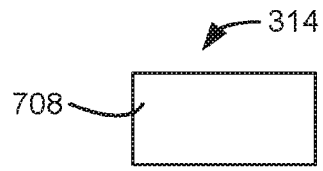
Figure 7C:
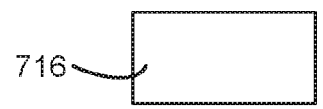

Energetic neutrals of the etch gas flow from the remote plasma generator 320 through the shower head 306 into the reactor chamber 310. Energetic neutrals may be energetic neutral atoms or energetic neutral molecules of the etch gas. In this example, plasma ions do not flow into the reactor chamber 310. The reactor chamber pressure is maintained at no less than 300 mTorr. The energetic neutrals selectively etch the stack 314 (step 128), by selectively etching Si with respect to SiGe. In this example, the selectively etching Si with respect to SiGe has a Si to SiGe etch ratio of greater than 20:1. FIG. 7C is a cross-sectional view of the stack 314 after the Si layer 712 has been selectively etched (step 128). In this example, the Si layer 712 has been completely etched away leaving SiGe layers 708, 716.

The VTM 212 transports the stack 314 from the etch chamber 220 to an ALD chamber 224 in a vacuum environment (step 132). If the stack 314 is not maintained in a vacuum environment, a new native oxide layer would grow on the stack 314.

An ALD layer is deposited on the stack 314 (step 136). FIG. 6 is a more detailed flow chart of the ALD layer deposition process (step 136). The atomic layer deposition process (step 136) comprises at least one cycle of providing a precursor (step 604) and converting the precursor (step 608). The precursor is provided to the stack 314 (step 604). In this embodiment, a liquid silicon containing precursor is vaporized and delivered in vapor form into the ALD chamber 224, to dose the stack 314 to saturation. A layer of precursor is formed over the stack 314. In this example, the precursor has a composition of the general type C(x)H(y)N(z)O(a)Si(b). In some embodiments, the liquid precursor has one of the following compositions: $C_6H_{19}N_3Si$, $C_8H_{22}N_2Si$, $C_9H_{23}NO_3Si$, and $C_{12}H_{28}O_4Si$. In this example, the providing of the precursor is plasmaless. The precursor has a silicon function group. The precursor forms a monolayer on the stack 314 since the precursor does not attach to another precursor.

Figure 7D:
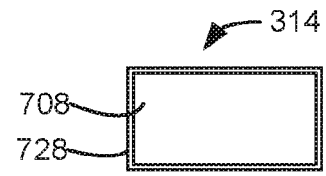
Figure 7D:
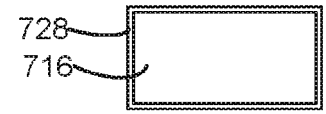

Once the stack 314 is dosed with the precursor, the delivery of the precursor vapor is stopped. Then a purge step is provided to purge out excessive precursors that linger in the ALD chamber 224. The precursor is then converted (step 608). In an embodiment, the conversion is accomplished by subjecting the stack 314 to a flash process. The flash process includes delivering a flash gas of 1000 sccm to 2000 sccm oxygen ($O_2$) to the ALD chamber 224. In this example, a power of 100 to 3000 watts is delivered at 13.56 MHz to form the flash gas into a plasma. A pressure of 20 mTorr to 100 mTorr is provided for between about 0.5 second and about 4 seconds. A silicon oxide monolayer is formed on the stack 314, using the monolayer of the silicon containing precursor. The ALD chamber 224 is then purged. The cycle may then be repeated. FIG. 7D is a cross-sectional view of the stack 314 after an ALD layer 728 has been deposited.

The resulting SiGe layers 708, 716 may be used as horizontal nanowires for p-type metal-oxide-semiconductor (PMOS) devices. This embodiment provides an etch selectivity greater than 20:1 for etching Si with respect to SiGe. In addition, less than 5 Å of SiGe is lost due to oxidation or etching during the process. This embodiment selectively etches Si with respect to silicon oxide ($SiO_2$) and silicon nitride (SiN) with a selectivity of greater than 100:1. The embodiment is able to provide the selective etch in less than 60 seconds.

During etching, energetic neutral molecules are used to selectively etch the Si layer 712 with respect to the SiGe layers 708, 716. To provide such an etch the energetic neutral molecules are generated by a remote plasma instead of exposing the stack 314 to a plasma, where the stack 314 would be bombarded by more ions than energetic neutral molecules. Reducing the ions that bombard the stack 314 helps to reduce the etching of the SiGe layers 708, 716. To further reduce etching of the SiGe layers 708, 716, the remote plasma is generated using a low RF power. In various embodiments, the RF power provided to generate the remote plasma is less than 300 watts. In addition, a bias of less than 50 volts is provided in various embodiments. An exemplary embodiment does not provide a bias. As a result, ions are not accelerated to the stack 314. An exemplary embodiment does not provide any RF power to the reactor chamber 310, where the stack 314 is located, but only to the remote plasma generator 320. A large gap of at least 50 mm is between the shower head 306 and the top of the stack 314. The gap further reduces the number of ions that reach the stack 314. In some embodiments, since the plasma is formed outside of the reactor chamber 310, the process in the reactor chamber 310 is plasmaless.

The pressure in the reactor chamber 310 maintained at no less than 300 mTorr. In an exemplary embodiment, the pressure is at least 500 mTorr. The higher pressure facilitates the selective etching of the Si layer 712 with respect to the SiGe layers 708, 716. Pressures of less than 100 mTorr would be used for etch processes that are dependent on ion etching. Since various embodiments instead etch using energetic neutrals, the pressure is maintained at no less than 300 mTorr. The higher pressure facilitates etching using energetic neutrals instead of ions. In addition, the higher pressure helps reduce the presence of ions and reduces undesirable species. It is believed that various embodiments may provide an etch selectivity of Si to SiGe of at least 50:1.

In the specification and claims the phrase "energetic neutrals" includes reactive neutral molecules or atoms.

In other embodiments, the break through process (step 108) may use a vapor etch or dry etch process. In an example of a break through process (step 108) that uses a vapor, a hydrogen fluoride (HF) vapor may be used to provide a break through process (step 108). An example of a dry break through process (step 108) would provide a plasma formed from $CF_4$ and a bias of 25 to 50 volts.

Instead of the stack 314 being initially encapsulated by a native oxide layer 520, an encapsulating layer may be formed to prevent consumption of the silicon in the formation of the native silicon oxide. The encapsulation layer may be $SiO_2$, deposited by ALD or may be SiN or SiC. Different break through processes (step 108) would be used for the different encapsulation layers. In other embodiments, instead of depositing $SiO_2$ during the depositing the ALD layer on the stack 314 (step 136), SiN or SiC may be deposited during the depositing the ALD layer on the stack 314 (step 136). A $SiO_2$, SiN, or SiC containing layer may be deposited in various embodiments.

In other embodiments, inert gases may be used provide inert conditions during the transfer of the stack 314 to the etch chamber 220 (step 112) or the transfer of the stack 314 to the ALD chamber 224 (step 124), instead of using inert conditions provided by a vacuum. Such an inert gas may be Ar or He or $N_2$. In other embodiments, an etch chamber 220 is equipped with precursors and fast response valves. In such an etch chamber 220, the depositing the ALD layer 528 on the stack 314 (step 136) may be performed in the etch chamber 220. In such an embodiment, the stack 314 is not transferred to an ALD chamber 224.

In another embodiment for selectively etching Si with respect to SiGe, an etch gas comprising $SF_6$ and $H_2$ may be used. The fluorine from $SF_6$ may be tied up by the hydrogen as HF, and SF may be used to passivate Ge in the form of Ge—F. The formation of Ge—F helps to further passivate SiGe. In other embodiments, the etch gas may comprise fluorocarbons, $SF_6$, and $H_2S$ or sulfur-containing gases with $H_2$. In some embodiments, with $CF_4$ and $H_2$, a $CF_4$ to $H_2$ ratio is between 1:1-1:1000. The above embodiments have a $SF_6$ to etch gas ratio of less than 1. The above embodiments have a $H_2S$ to etch gas ratio of less than 1. In some embodiments, $CF_4$ could be replaced by another hydrofluorocarbon.

Figure 8A:
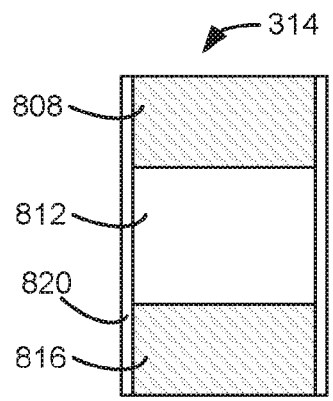
FIGS. 8A-C are schematic cross-sectional views of a stack processed according to another embodiment.
Figure 8B:
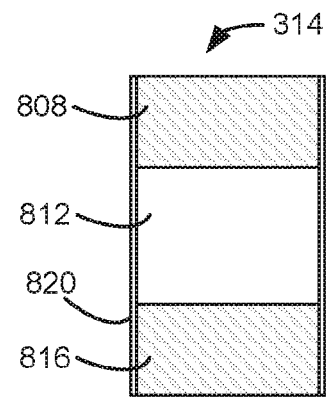

In another embodiment for selectively etching SiGe with respect to Si, a wet breakthrough is provided. FIG. 8A is a schematic cross-sectional view of part of a stack 314 on a wafer. In this embodiment, the stack 314 comprises a first Si layer 808 adjacent to a SiGe layer 812. The SiGe layer 812 is adjacent to a second Si layer 816. The first Si layer 808 and the second Si layer 816 are on opposite sides of the SiGe layer 812. An encapsulating layer in the form of a native oxide layer 820 forms on the sides of the first Si layer 808, SiGe layer 812, and second Si layer 816, due to the exposure of the stack 314 to air. The break through is partially provided by exposing the stack 314 to a solution of diluted hydrofluoric acid (49%) in water with a volume dilution of 300:1-10:1 at room temperature (RT) for a sufficient time to remove part, but not all of the native oxide layer 820. FIG. 8B is a cross-sectional view of the stack 314 after the native oxide layer 820 has been partially removed.

Figure 8C:
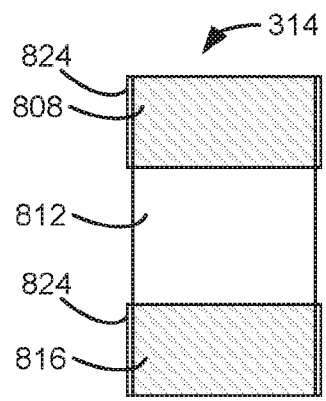

The remainder of the native oxide layer 820 is removed using a dry etch process using a fluorocarbon break through gas. In this example the fluorocarbon break through gas comprises $CF_4$. The break through gas is formed into a plasma. The plasma from the break through gas removes the remaining native oxide layer 820 and selectively deposits an amorphous carbon coating the first Si layer 808 and the second Si layer 816 with respect to the SiGe layer 812. FIG. 8C is a cross-sectional view of the stack 314 after an amorphous carbon layer 824 has been selectively deposited in the first Si layer 808 and the second Si layer 816. The etch and ALD processes used in the other embodiments may be used to selectively etch the SiGe layer 812 with respect to the first Si layer 808 and the second Si layer 816. The amorphous carbon layer 824 prevents the first Si layer 808 and the second Si layer 816 from oxidizing and reduces etching of the first Si layer 808 and the second Si layer 816. By partially etching the native oxide layer 820 using a wet etch, the time needed for the dry etch is reduced. Reducing the dry etch time reduces the time the substrate is exposed to ions and thus reduces etching of the first Si layer 808 and the second Si layer 816 by the dry etch.

While this disclosure has been described in terms of several exemplary embodiments, there are alterations, modifications, permutations, and various substitute equivalents, which fall within the scope of this disclosure. It should also be noted that there are many alternative ways of implementing the methods and apparatuses of the present disclosure. It is therefore intended that the following appended claims be interpreted as including all such alterations, modifications, permutations, and various substitute equivalents as fall within the true spirit and scope of the present disclosure.

What is claimed is:

1. A method for forming silicon nanowires by selectively etching silicon germanium with respect to silicon in a stack on a chuck in an etch chamber, wherein the stack comprises a first silicon layer and a second silicon layer and a silicon germanium layer separating the first silicon layer and the second silicon layer, comprising:
   maintaining the chuck at a temperature at or below 0° C.; and
   exposing the stack to an etch gas comprising a fluorine containing gas to selectively etch silicon germanium with respect to silicon wherein the silicon germanium layer is completely etched away from between the first silicon layer and second silicon layer to form a gap between the first silicon layer and the second silicon layer to form the first silicon layer and second silicon layer into silicon nanowires; and
   depositing a $SiO_2$, SiN, or SiC containing layer on surfaces of the silicon nanowires using atomic layer deposition after exposing the stack to the etch gas in the etch chamber, wherein the $SiO_2$, SiN, or SiC containing layer encircles the silicon nanowires.

2. The method, as recited in claim 1, wherein the etch gas has a total flow per etch gas molecule, and wherein the fluorine containing gas comprises fluorine, wherein the fluorine has a fluorine flow per fluorine atom, wherein a ratio of the total flow per etch gas molecule to the fluorine flow per fluorine atom is between 1000:1 to 3:1.

3. The method, as recited in claim 1, further comprising:
   forming the etch gas into a plasma with ions and energetic neutrals of the etch gas in a remote plasma generator; and
   flowing the energetic neutrals from the remote plasma generator into the etch chamber.

4. The method, as recited in claim 3, wherein the etch gas is not maintained as a plasma in the etch chamber so that the stack is exposed to the energetic neutrals.

5. The method, as recited in claim 1, wherein the etch gas further comprises a noble gas.

6. The method, as recited in claim 1, wherein the fluorine containing gas comprises $CF_4$.

7. The method, as recited in claim 1, further comprises maintaining an etch chamber pressure of at least 300 mTorr.

8. The method, as recited in claim 1, further comprising:
    transferring the stack from the etch chamber to an atomic layer deposition chamber in inert conditions.

9. The method, as recited in claim 1, wherein an encapsulating layer is formed on sides of the stack, the method further comprising removing the encapsulating layer from the stack using a break through process.

10. The method, as recited in claim 9, wherein the break through process comprises providing a wet etch of the encapsulating layer.

11. The method, as recited in claim 10, wherein the break through process further comprises a dry etch after the wet etch.

12. The method, as recited in claim 9, wherein the break through process comprises providing a vapor etch or dry etch of the encapsulating layer.

13. The method, as recited in claim 1, wherein the maintaining the chuck at a temperature at or below 0° C., maintains the chuck at a temperature of less than or equal to −15° C.

14. The method, as recited in claim 1, wherein the fluorine containing gas comprises a hydrofluorocarbon.

* * * * *